(12) United States Patent
Aoki et al.

(10) Patent No.: US 9,674,461 B2
(45) Date of Patent: Jun. 6, 2017

(54) IMAGING DEVICE AND IMAGING METHOD

(71) Applicant: FUJIFILM Corporation, Tokyo (JP)

(72) Inventors: Takashi Aoki, Saitama (JP); Yasuo Ootsuki, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/057,626

(22) Filed: Mar. 1, 2016

(65) Prior Publication Data

US 2016/0182792 A1    Jun. 23, 2016

Related U.S. Application Data

(63) Continuation of application No. PCT/JP2014/074816, filed on Sep. 19, 2014.

(30) Foreign Application Priority Data

Sep. 27, 2013    (JP) ................ 2013-202083

(51) Int. Cl.
*H04N 5/238*    (2006.01)
*G03B 9/02*    (2006.01)
(Continued)

(52) U.S. Cl.
CPC ........... *H04N 5/238* (2013.01); *G02B 3/0056* (2013.01); *G03B 7/26* (2013.01); *G03B 9/02* (2013.01);
(Continued)

(58) Field of Classification Search
CPC .......... G02B 3/0056; H03B 7/26; G03B 9/02; H01L 27/307; H04N 5/2254;
(Continued)

(56) References Cited

U.S. PATENT DOCUMENTS

2007/0098398 A1* 5/2007 Hagiwara ............ H04N 5/2254
                                                       396/505
2007/0133983 A1* 6/2007 Traff ........................ G02B 5/23
                                                       396/506
(Continued)

FOREIGN PATENT DOCUMENTS

JP          5-130513 A      5/1993
JP       2006-105771 A      4/2006
(Continued)

OTHER PUBLICATIONS

International Search Report for PCT/JP2014/074816 mailed on Dec. 2, 2014.
(Continued)

*Primary Examiner* — Amy Hsu
(74) *Attorney, Agent, or Firm* — Birch, Stewart, Kolasch & Birch, LLP

(57) ABSTRACT

The imaging device 1 has an image sensor 14 and an electronic diaphragm section. In the image sensor 14, a plurality of pixels having an organic layer for photoelectric conversion is two-dimensionally arranged. Each pixel of the image sensor 14 is divided into a plurality of regions. The pixel has an on-chip microlens 15, which forms a pupil image of a photography optical system 12 on the plurality of regions, and reading sections 16 which respectively read photoelectrically converted signals of the divided regions. The electronic diaphragm section electronically controls an aperture value, and selects divided regions, which are read by the reading sections 16, on the basis of the aperture value, or selects a signal from the signals of the plurality of divided regions, which are read by the reading sections 16, on the basis of the aperture value.

10 Claims, 12 Drawing Sheets

(51) Int. Cl.
*H04N 5/374* (2011.01)
*H01L 27/30* (2006.01)
*H04N 5/235* (2006.01)
*H04N 9/04* (2006.01)
*G02B 3/00* (2006.01)
*G03B 7/26* (2006.01)
*H04N 5/225* (2006.01)

(52) U.S. Cl.
CPC ......... *H01L 27/307* (2013.01); *H04N 5/2254* (2013.01); *H04N 5/2351* (2013.01); *H04N 5/2353* (2013.01); *H04N 5/374* (2013.01); *H04N 9/045* (2013.01)

(58) Field of Classification Search
CPC .... H04N 5/2351; H04N 5/2353; H04N 5/238; H04N 5/374; H04N 9/045
See application file for complete search history.

(56) References Cited

U.S. PATENT DOCUMENTS

| 2010/0177226 | A1* | 7/2010 | Itonaga | H01L 27/14603 348/300 |
| 2011/0049661 | A1* | 3/2011 | Maehara | H01L 27/307 257/432 |
| 2014/0085498 | A1* | 3/2014 | Hatano | H04N 9/07 348/221.1 |
| 2016/0182794 | A1* | 6/2016 | Aoki | H04N 5/243 348/229.1 |

FOREIGN PATENT DOCUMENTS

| JP | 2009-159357 A | 7/2009 |
| JP | 2011-71483 A | 4/2011 |
| JP | 2013-246215 A | 12/2013 |

OTHER PUBLICATIONS

Written Opinion of the International Searching Authority for PCT/JP2014/074816 mailed on Dec. 2, 2014.

\* cited by examiner

IMAGING DEVICE AND IMAGING METHOD

CROSS-REFERENCE TO RELATED APPLICATIONS

This application is a Continuation of PCT International Application No. PCT/JP2014/074816 filed on Sep. 19, 2014, which claims priority under 35 U.S.C. §119(a) to Japanese Patent Application No. 2013-202083 filed on Sep. 27, 2013. Each of the above applications is hereby expressly incorporated by reference, in their entirety, into the present application.

BACKGROUND OF THE INVENTION

1. Field of the Invention

The present invention relates to an imaging device and an imaging method. In particular, the present invention relates to an imaging device, which has an image sensor where an organic layer serves as a photoelectric conversion section, and an imaging method therefor.

2. Description of the Related Art

In conventional cameras having mechanical diaphragms, an aperture value (F number) used when the imaging element is exposed is fixed to a single value, and thus only an image according to the aperture value can be obtained. Hence, it is difficult for conventional cameras to obtain images based on a plurality of aperture values through a single exposure operation.

JP2009-159357A proposed an imaging device in which a single microlens is provided for a plurality of pixels of the imaging element and an image is reconstructed by weighting pixel data which is obtained from the plurality of pixels. Thereby, a depth of field of a captured image is adjusted, or characteristic blurring is expressed.

JP2006-105771A proposed an imaging device that independently captures images which are obtained from rays passing through two different pupil regions of a photography lens. Thereby, it is possible to obtain a stereoscopic image through a single image capturing operation.

JP1993-130513A (JP-H05-130513A) proposed a solid-state imaging device that is capable of nondestructive reading and reads a plurality of pixel data pieces during the same or different exposure time periods. Thereby, it is possible to acquire data pieces of pixels which are read during different exposure time periods.

However, generally, an image sensor uses photodiodes having a silicon crystalline structure which is formed in a silicon substrate as a photoelectric conversion layer. In recent years, JP2011-071483A proposed an image sensor in which an organic layer serves as a photoelectric conversion section.

Further, the photoelectric conversion section formed of the organic layer of the image sensor proposed in JP2011-071483A has an absorption coefficient larger than that of the photodiodes, and therefore reduction in thickness is achieved. As a result, there are the following advantages: electric charge diffusion to adjacent pixels is small; optical color mixture and electric color mixture (crosstalk) are unlikely to occur even when an angle of rays incident onto a light receiving surface is large; and the reduction in thickness is appropriate for miniaturization of the pixel size.

SUMMARY OF THE INVENTION

In the imaging devices proposed in JP2009-159357A, JP2006-105771A, JP1993-130513A (JP-H05-130513A), and JP2011-071483A, a technique of controlling an aperture value without using a mechanical diaphragm is not disclosed. Further, a technique for acquiring images based on a plurality of aperture values through a single photography operation is not disclosed.

The present invention has been made in consideration of such situations, and its object is to provide an imaging device and an imaging method capable of controlling an aperture value without using a mechanical diaphragm and acquiring a plurality of images with different aperture values through a single photography operation so as to obtain a high-quality image in which color mixture is minimized.

According to an aspect of the present invention, there is provided an imaging device including: an image sensor that is configured such that a plurality of pixels having an organic layer for photoelectric conversion is two-dimensionally arranged, and each pixel of the plurality of pixels is divided into a plurality of regions, and has an on-chip microlens, which forms a pupil image of a photography optical system on the plurality of regions, and reading sections which respectively read photoelectrically converted signals of the divided regions; and an electronic diaphragm section that electronically controls an aperture value, and that selects a divided region, which is read by the reading section, on the basis of the aperture value, or selects a signal from the signals of the plurality of divided regions, which are read by the reading sections, on the basis of the aperture value.

According to the present aspect, the electronic diaphragm section selects the divided pixel regions or the signals thereof in accordance with the aperture value. Thereby, in the present aspect, it is possible to acquire an image according to a desired aperture value even without a mechanical diaphragm.

Further, according to the present aspect, the image sensor having the organic layer is used, and thus the photoelectric conversion section can be made to be thin. Thereby, in the present aspect, even in the pixel divided into the plurality of regions using the on-chip microlens, it is possible to acquire an image in which color mixture is minimized.

Here, the aperture value is a value indicating a degree of aperture used in the imaging device having the mechanical diaphragm. For example, as the aperture value, it is possible to employ an F number.

Preferably, the imaging device further includes an image generation section that generates an image on the basis of the signals, which are read by the reading sections from the divided regions selected by the electronic diaphragm section, or the signals selected by the electronic diaphragm section, in which the electronic diaphragm section reads the signals from the plurality of divided regions corresponding to a plurality of aperture values, or selects the signals of the plurality of divided regions corresponding to the plurality of aperture values, and in which the image generation section generates an image for each of the aperture values of the plurality of aperture values.

According to the present aspect, the image generation section generates the image on the basis of the signals, which are read by the reading sections from the divided regions selected by the electronic diaphragm section, or the signals selected by the electronic diaphragm section. Thereby, in the present aspect, it is possible to acquire an image for each aperture value of the plurality of aperture values through a single photography operation.

Preferably, each pixel of the image sensor has divided regions which have smaller division widths in the center portion of the pixel than those in the peripheral portion of the pixel.

According to the present aspect, there are provided the divided regions which have smaller division widths in the center portion of the pixel than those in the peripheral portion of the pixel. Thereby, in the present aspect, it is possible to divide the pixel in a form according to a correspondence relationship between a ray angle and the aperture value, and it is possible to acquire an image based on an appropriate aperture value.

Preferably, each pixel of the image sensor has divided regions which have the same division widths.

According to the present aspect, the pixel has the divided regions which have the same division widths. Thereby, in the present aspect, it is possible to effectively manufacture the image sensor.

Preferably, the image sensor has a filter constituted of a plurality of monochromatic color filters, the monochromatic color filters are disposed to correspond to the pixels, and the pixels have divided regions which have different division widths in accordance with colors of the monochromatic color filters.

According to the present aspect, the pixels have the divided regions which have the different division widths in accordance with the colors of the color filters. Thereby, in the present aspect, it is possible to change the division widths in accordance with a wavelength of light, and it is possible to receive the light by appropriately divided regions.

Preferably, each pixel of the image sensor disposed in the central portion of the image sensor is divided into regions symmetric to each other with respect to the center of the pixel, and each pixel of the image sensor disposed in the peripheral portion of the image sensor is divided into regions non-symmetric to each other with respect to the center of the pixel.

According to the present aspect, in accordance with the positions where the pixels are arranged in the image sensor, the method of dividing the pixels is different. Thereby, in the present aspect, the pixels are able to more accurately capture light. This is a so-called scaling.

Preferably, the reading sections change the exposure time periods of the signals based on the plurality of aperture values and perform non-destructive reading when reading the signals from the plurality of divided regions corresponding to the plurality of aperture values through the electronic diaphragm section, and the electronic diaphragm section performs exposure for a longer time when selecting the divided regions on the basis of the aperture values on a small-aperture side than when selecting the divided regions on the basis of the aperture values on an open-side.

According to the present aspect, when the divided regions are selected on the basis of the aperture values on the open-side, long exposure is performed. Thereby, in the present aspect, even when creating an image on the basis of only a few divided regions selected by the electronic diaphragm section in accordance with the aperture values on the small-aperture side, it is possible to secure a sufficient amount of light.

Preferably, the imaging device further includes an amplification section that amplifies the signals which are read by the reading sections, in which the amplification section makes amplification degrees of the signals, which are read from the divided regions in the peripheral portion of the pixel, smaller than amplification degrees of the signals which are read from the divided regions in the central portion of the pixel.

According to the present aspect, the amplification degrees of the signals, which are read from the divided regions in the peripheral portion of the pixel, are set to be smaller than the amplification degrees of the signals which are read from the divided regions in the central portion of the pixel. Thereby, according to the present aspect, it is possible to obtain an image in which desired blurring is expressed.

Preferably, when the reading section reads the signals from the plurality of divided regions, the exposure time periods of the signals from the divided regions in the central portion of the pixel are set to be longer than the exposure time periods of the signals from the divided regions in the peripheral portion of the pixel.

According to the present aspect, the exposure time periods for the divided regions in the central portion of the pixel are set to be longer than the exposure time periods for the divided regions in the peripheral portion of the pixel. That is, the exposure time period for the divided regions in the central portion of the pixel is set to be longer than that for the divided regions in the peripheral portion of the pixel. Thereby, according to the present aspect, it is possible to obtain an image in which desired blurring is expressed.

According to another aspect of the present invention, there is provided an imaging method including: a reading step of respectively reading photoelectrically converted signals of a plurality of regions by using an image sensor that is configured such that a plurality of pixels having an organic layer for photoelectric conversion is two-dimensionally arranged, where each pixel of the plurality of pixels is divided into the plurality of regions, and each pixel has an on-chip microlens which forms a pupil image of a photography optical system on the plurality of regions; and an electronic diaphragm step of electronically controlling an aperture value, and selecting divided regions, which are read by the reading sections, on the basis of the aperture value, or selecting signals from the signals of the plurality of divided regions, which are read by the reading sections, on the basis of the aperture value.

According to the present invention, the regions of the pixels divided by the electronic diaphragm section are selected, or the signals, which are read from the divided regions of the pixels, are selected, thereby generating an image on the basis of the signals. Accordingly, it is possible to acquire an image based on a desired aperture value even without a mechanical diaphragm. Furthermore, according to the present invention, the image sensor capable of reducing the thickness of the photoelectric conversion section is used, and thus it is possible to acquire an image in which color mixture is minimized.

DESCRIPTION OF THE PREFERRED EMBODIMENTS

Hereinafter, referring to accompanying drawings, preferred embodiments of an imaging device and an imaging method according to the present invention will be described.

<Appearance of Imaging Device>

Figure 1:
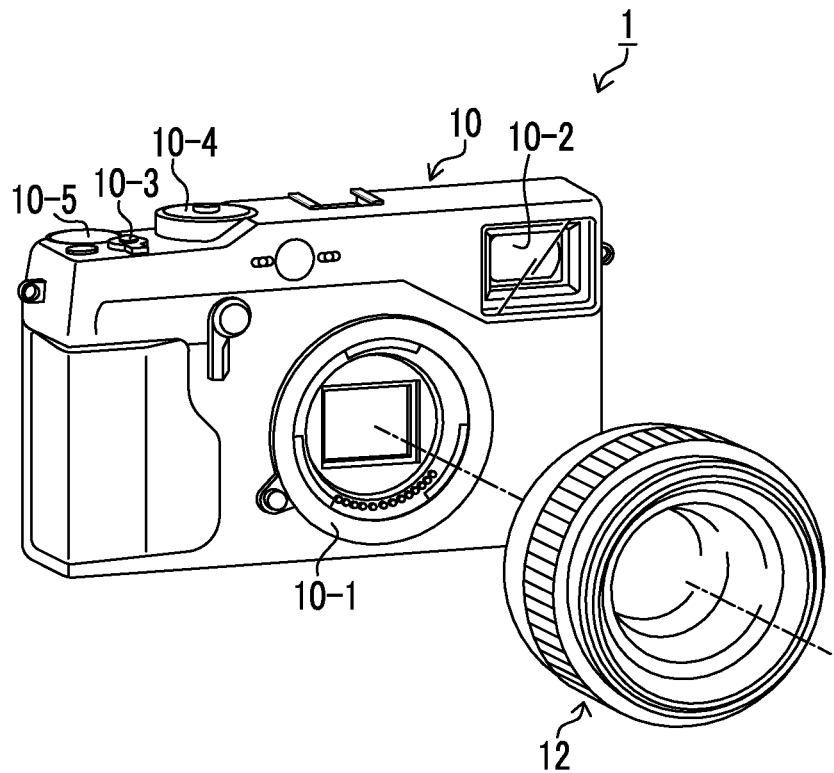
FIG. 1 is a perspective view of an imaging device.
Figure 2:
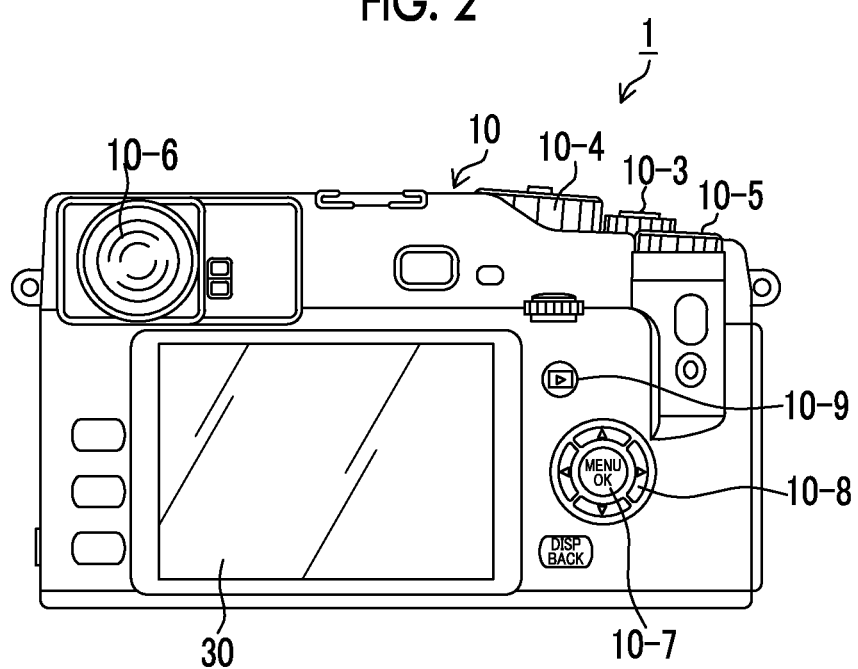
FIG. 2 is a rear view of the imaging device.

FIG. 1 is a perspective view of an imaging device according to the present invention as viewed obliquely from the front thereof. FIG. 2 is a rear view of the imaging device.

As shown in FIG. 1, the imaging device 1 includes a camera main body 10, and an interchangeable lens (photography optical system) 12 which is detachably mounted on the camera main body 10.

A mount 10-1 on which the interchangeable lens unit 12 is mounted, a finder window 10-2 of an optical finder, and the like are provided on the front of the camera main body 10. A shutter release button 10-3, a shutter speed dial 10-4, an exposure correction dial 10-5, and the like are provided on the upper surface of the camera main body 10.

Further, as shown in FIG. 2, mainly a liquid crystal monitor 30, an eyepiece section 10-6 of the optical finder, a MENU/OK button 10-7, an arrow key 10-8, a reproduction button 10-9, and the like are provided on the rear surface of the camera main body 10.

The liquid crystal monitor 30 functions as a display section that not only displays a live view image in a photography mode or a captured image in a reproduction mode but also displays various menu screens. The MENU/OK button 10-7 is an operation button having both a function as a menu button to give a command to display a menu screen on the liquid crystal monitor 30 and a function as an OK button to give a command to confirm and execute selected contents. The arrow key 10-8 is an operation section to input instructions of four directions of up, down, right, and left, and functions as a button that is for selecting an item from the menu screen or for giving an instruction to select various setting items from the menus. Further, the up/down key of the arrow key 10-8 functions as a zoom switch at the time of photography or a reproduction zoom switch in the reproduction mode, and the right/left key functions as a frame advance (forward-direction/opposite-direction advance) button in the reproduction mode. The reproduction button 10-9 is a button to switch to a reproduction mode to display a captured and recorded still image or moving image on the liquid crystal monitor 30.

<Configuration of Imaging Device>

Figure 3:
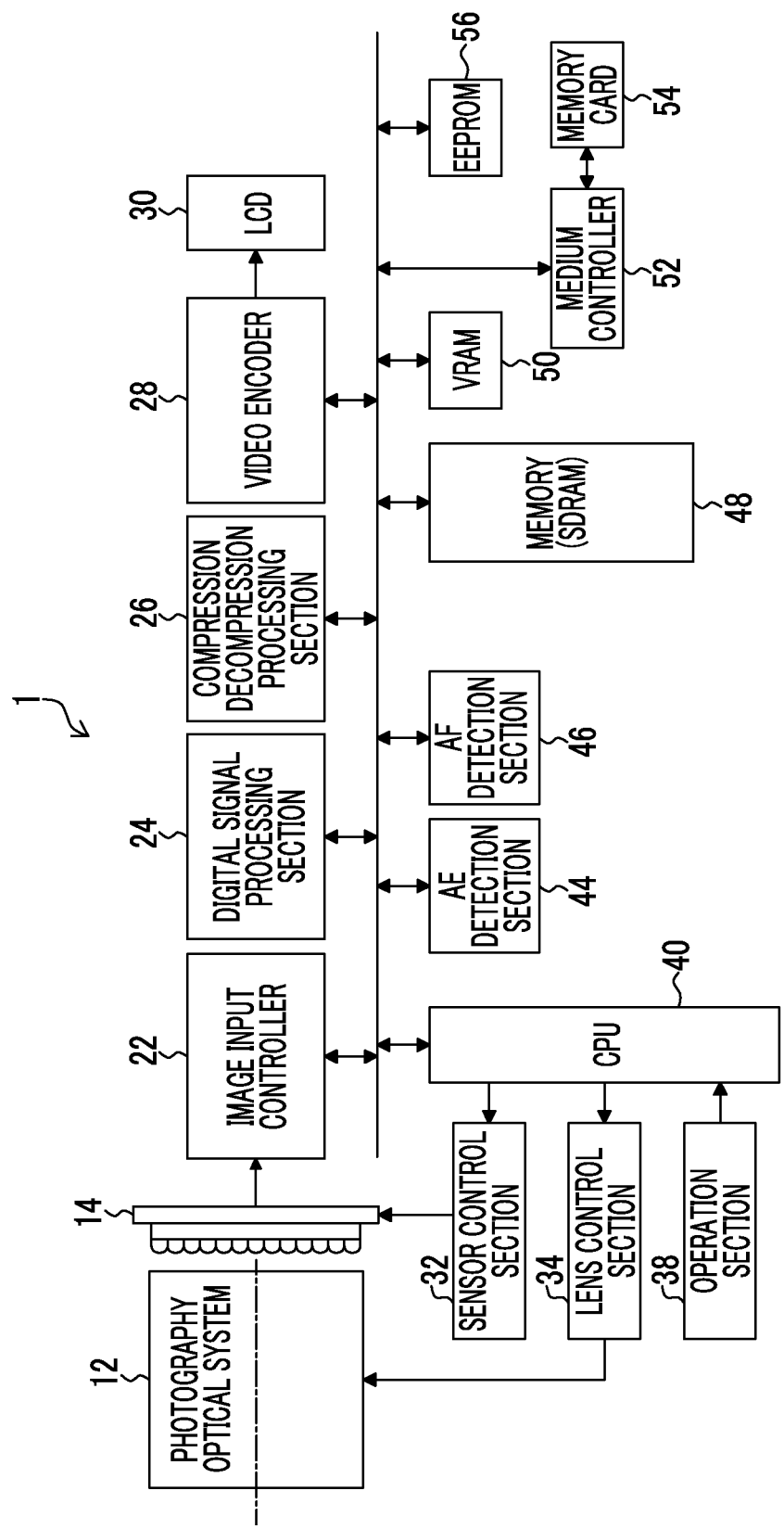
FIG. 3 is a block diagram of the imaging device.

FIG. 3 is a block diagram illustrating an embodiment of a configuration of the imaging device 1.

The imaging device 1 is characterized mainly in an image sensor 14 in that an image captured through a photography optical system (interchangeable lens) 12 and the image sensor 14 is recorded in a memory card 54.

[Image Sensor]

Figure 4:
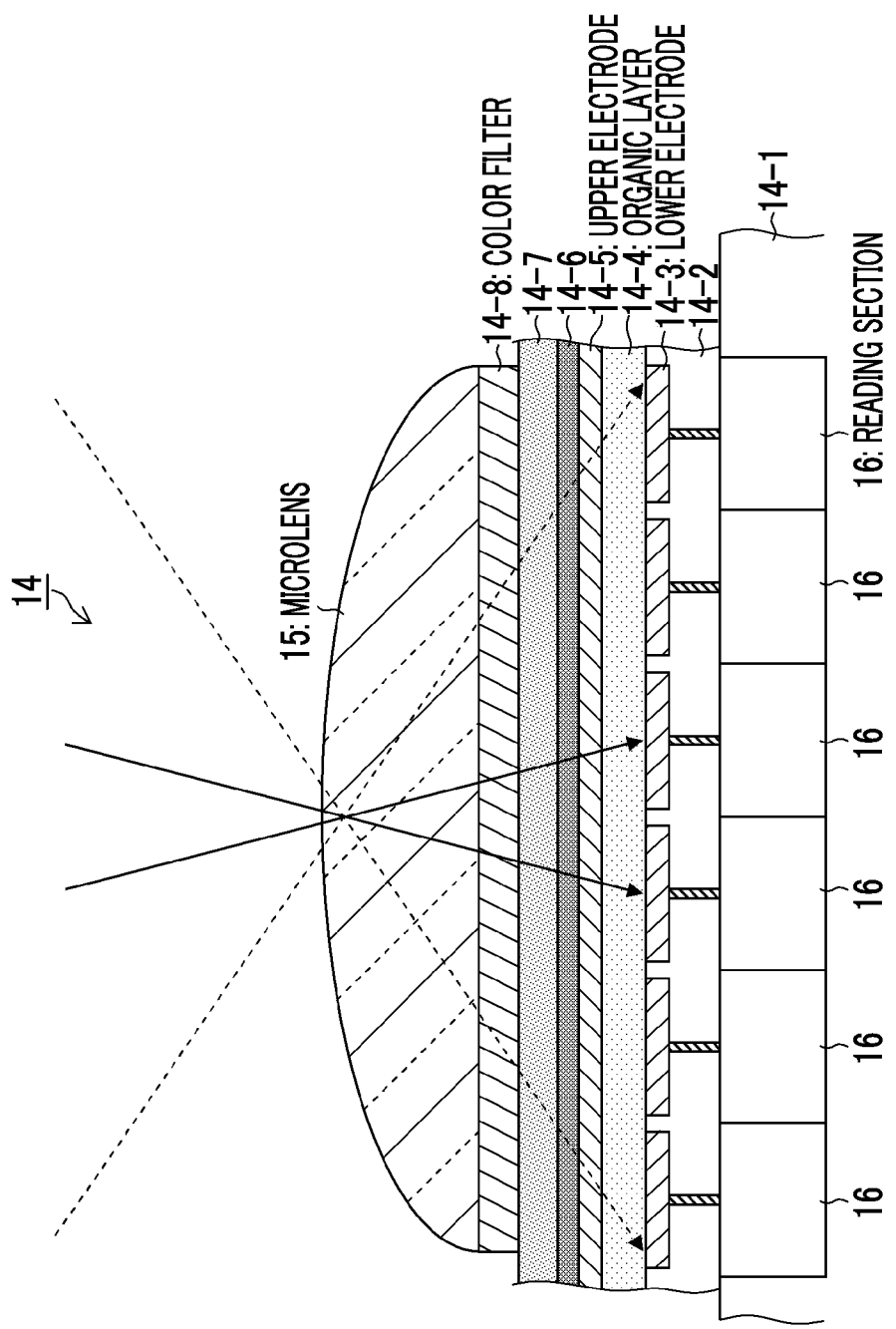
FIG. 4 is a schematic sectional view illustrating a configuration of a pixel.

FIG. 4 is a schematic sectional view illustrating a configuration of a single pixel of the image sensor 14.

The image sensor 14 shown in the drawing has an organic layer 14-4 as a photoelectric conversion section. Each one pixel thereof corresponding to a single microlens (on-chip microlens) 15 is divided into a plurality of regions (in the example, 36 regions which are divided in a lattice shape of 6×6). A signal corresponding to signal charge accumulated for each divided region (sectioned region) can be separately read by a reading section 16 formed in the image sensor 14.

That is, the image sensor 14 includes a substrate 14-1, an insulation layer 14-2, lower electrodes (separated electrodes) 14-3, an organic layer 14-4, a common upper electrode 14-5, a buffer layer 14-6, a sealing layer 14-7, color filters 14-8, microlenses 15, and reading sections 16. In addition, each separated electrode 14-3 corresponds to each divided region. Thus, in the organic layer 14-4, there is no separation region for separating the divided regions.

The substrate 14-1 is a semiconductor substrate such as a glass substrate or a Si (silicon) substrate. The reading sections 16 having capacitors are formed as complementary metal oxide semiconductor (CMOS) circuits on the substrate 14-1.

The insulation layer 14-2 is formed on the substrate 14-1. The plurality of separated electrodes 14-3 is formed on the surface of the insulation layer 14-2.

The organic layer 14-4 is formed of a panchromatic photosensitivity organic photoelectric conversion film which is thin. The organic photoelectric conversion film is a structure-free continuous film, and can be provided on the substrate 14-1 having the reading sections 16 (CMOS circuits). Accordingly, the film does not need expensive microfabrication processes required in a silicon technology, and is appropriate for pixel miniaturization.

The upper electrode 14-5 is an electrode that faces the separated electrodes 14-3, and is formed on the organic layer 14-4. The upper electrode 14-5 causes light to be incident into the organic layer 14-4, and is thus made of a conductive material which is transparent to the incident light.

The image sensor 14 includes a voltage supply section (not shown in the drawing) that applies a voltage between the separated electrodes 14-3 and the upper electrode 14-5. In a state where the voltage is applied between the separated electrodes 14-3 and the upper electrode 14-5, light may be incident into the organic layer 14-4. In this case, the organic layer 14-4 generates electric charge corresponding to the amount of light. However, the separated electrode 14-3 functions as a charge collection electrode for collecting electric charge generated in the organic layer 14-4.

The buffer layer 14-6 is formed on the upper electrode 14-5, and the sealing layer 14-7 is formed on the buffer layer 14-6. Further, the color filters 14-8 are provided on the sealing layer 14-7.

The color filters 14-8 have colors of red (R), green (G) or blue (B). Each color filter 14-8 having any one color thereof can be assigned to each one microlens 15 (one pixel). Thereby, the color filters 14-8 are formed in a predetermined pattern array (such as a Bayer array, a G stripe R/G full checkered array, an X-Trans (registered trademark) array, or a honeycomb array).

The microlenses 15 is provided on the color filter 14-8. In addition, the microlens 15 is not limited to the case where it is directly provided on the color filter 14-8, and may be provided with a transparent protective layer interposed therebetween.

As described above, the microlenses 15 are configured such that one microlens 15 is assigned to one pixel formed of 36 divided regions.

The microlens 15 forms a pupil image corresponding to the photography optical system 12 on the organic layer 14-4, and concentrates rays, which are incident through the photography optical system 12, for each incidence direction, thereby forming an image thereof on the organic layer 14-4. When the focus is on the microlens 15, an image (pupil image) of light on the organic layer 14-4 under than the microlens 15 is distributed in accordance with an aperture value (F number) of the photography optical system 12. Accordingly, among the plurality of divided regions constituting one pixel, a signal of a desired divided region corresponding to the aperture value is selected, thereby generating one pixel signal. In such a manner, the aperture value can be electronically controlled. In addition, an electronic diaphragm section, which electronically controls the aperture value, will be described later in detail.

For example, in a conventional back-illuminated Si CMOS sensor, the reading sections (including capacitors) 16 are formed on a side opposite to a light-illuminated surface. However, since Si has a low absorption coefficient to obliquely incident light, the obliquely incident light leaks into adjacent pixels. Further, electric charge generated on the illuminated surface moves horizontally while reaching the reading sections 16 on the opposite side, and is read from the reading sections 16 of the adjacent pixels.

However, in the image sensor 14 of the configuration, the organic layer 14-4 has a high light absorption coefficient. Accordingly, a photoelectric conversion section can be made to be thin. Thus, in a normal CMOS sensor, mixture of electric charge into adjacent pixels is unlikely to occur.

Figure 5:
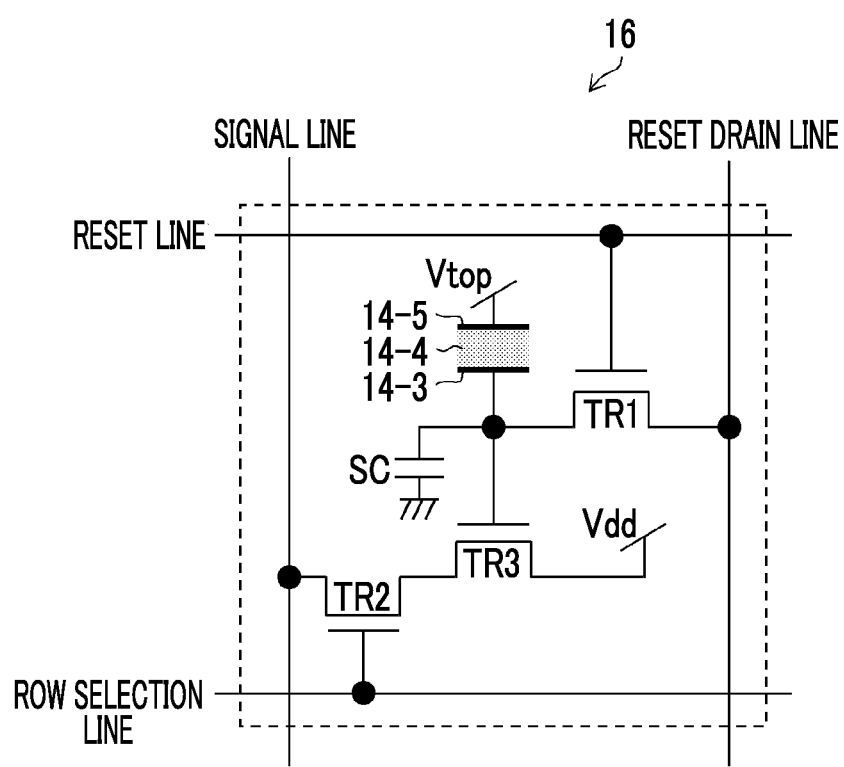
FIG. 5 is a circuit diagram of a reading section.

FIG. 5 is a circuit diagram illustrating a configuration of the reading section 16, and shows the reading section 16 corresponding to the single divided region.

As the reading section 16, a CMOS circuit capable of repeatedly reading a signal corresponding to accumulated electric charge in a nondestructive manner is employed. Further, in terms of noise and high-speed performance, it is preferable to employ a CMOS circuit.

As shown in FIG. 5, the reading section 16 includes a capacitor SC, transistors TR1, TR2, and TR3, and the like.

When a voltage Vtop is applied between the separated electrode (lower electrode) 14-3 and the upper electrode 14-5 and light is incident into the organic layer 14-4, the organic layer 14-4 generates electric charge corresponding to an amount of incident light. The electric charge generated in the organic layer 14-4 is collected by the separated electrode 14-3, and accumulated in the capacitor SC.

The reset line is for turning on/off a transistor TR1. When a gate of the transistor TR1 is turned on in response to the signal of the reset line, the electric charge accumulated in the capacitor SC is discharged to the reset and drain lines through the transistor TR1, and is reset to zero.

Row selection signals are applied to row selection lines from a vertical driver 18-1 to be described later. Thus, signals corresponding to electric charges accumulated in the respective capacitors SC are output to the signal lines from the reading sections 16 in a single row corresponding to the row selection line to which the row selection signal is applied. That is, the voltage corresponding to electric charge accumulated in the capacitor SC is output as a signal of the divided region to the signal line through a source follower amplifier formed of the transistor TR2 and the transistor TR3.

Next, a configuration example of peripheral circuits of the image sensor 14 will be described.

Figure 6:
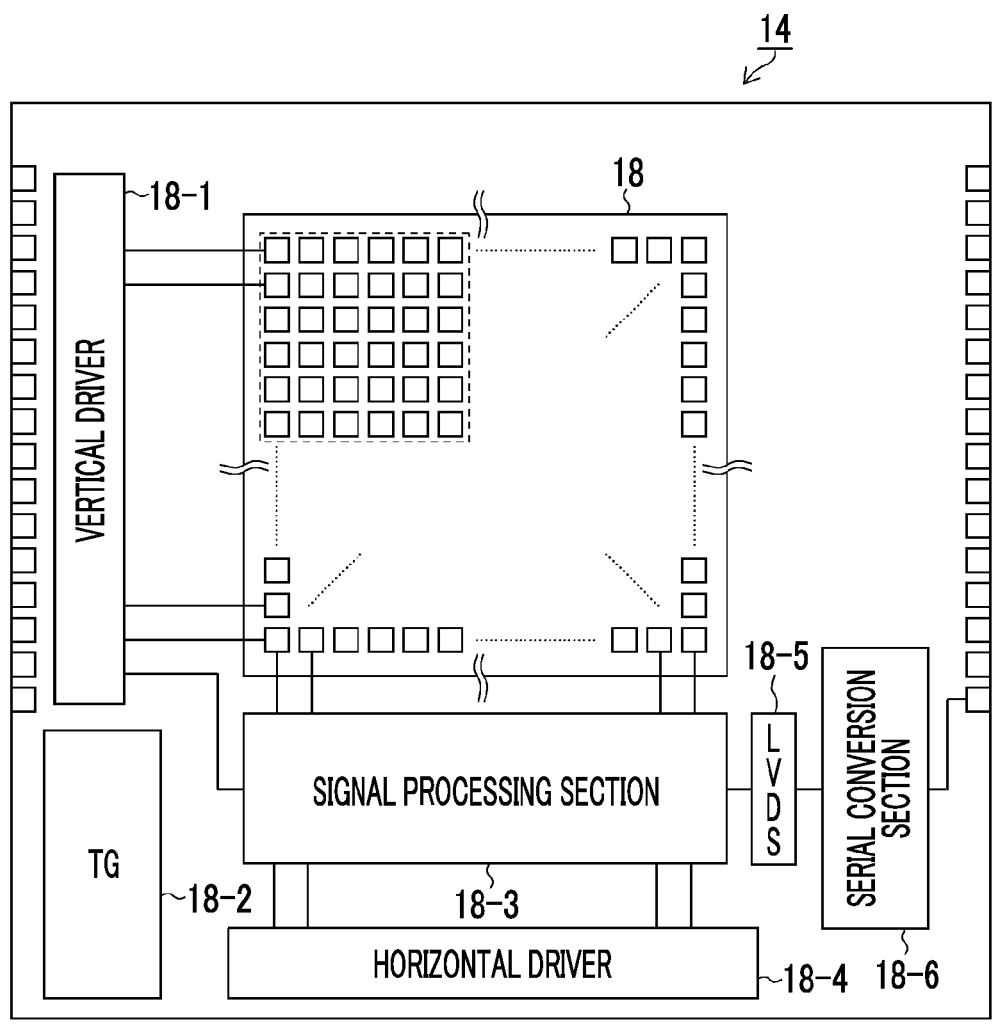
FIG. 6 is a diagram illustrating an example of the entire configuration including peripheral circuits of the image sensor shown in FIG. 4.

FIG. 6 is a diagram illustrating an example of the entire configuration including peripheral circuits of the image sensor 14 shown in FIG. 4.

As shown in FIG. 6, the image sensor 14 has not only the components shown in FIG. 4 but also a vertical driver 18-1, a timing generator 18-2, a signal processing section (circuit) 18-3, a horizontal driver 18-4, an LVDS (low voltage differential signaling) 18-5, and a serial conversion section 18-6.

In the pixel region (image sensor) 18, a plurality of pixels is two-dimensionally arranged. The region indicated by a dotted line shows a plurality of divided regions each of which constitutes one pixel.

The timing generator 18-2 supplies a timing signal for driving the image sensor 14, and performs reading control of thinning-out reading, partial reading, and the like. The signal processing section 18-3 is provided to correspond to respective columns of the reading sections 16. The vertical driver 18-1 selects the reading sections 16 in a single row, and reads the signals from the selected reading sections 16. The signal processing section 18-3 performs correlated double sampling (CDS) processing on the signals, which are read by the vertical driver 18-1 and are output from the respective columns, corresponding to the single row, and converts the processed signals into digital signals. The signals processed by the signal processing section 18-3 are stored in a memory 48 which is provided for each column. The horizontal driver 18-4 performs control to sequentially read the signals, which are stored in the memory 48 of the signal processing section 18-3, corresponding to the single row and to output the signals to the LVDS 18-5. The digital signals are transmitted in accordance with the LVDS 18-5. The serial conversion section 18-6 converts the input parallel digital signals into serial digital signals, and outputs the signals.

It should be noted that the serial conversion section 18-6 may be omitted. Further, the following configuration may be adopted: the signal processing section 18-3 performs only the correlated double sampling processing, and an AD conversion section is provided instead of the LVDS 18-5. Furthermore, the following configuration may be adopted: the signal processing section 18-3 performs only the correlated double sampling processing, and the LVDS 18-5 and the serial conversion section 18-6 are omitted.

Returning to FIG. 3, the imaging device 1 includes the image sensor 14 shown in FIGS. 4 to 6. The operations of the entire device are integrally controlled by a central processing unit (CPU) 40 on the basis of a camera control program stored in electrically erasable programmable read-only memory (EEPROM) 56. In addition, the EEPROM 56 stores not only the camera control program but also defect information of the pixels of the image sensor 14, various parameters and tables used in image processing or the like.

The imaging device 1 is provided with an operation section 38 including the shutter release button 10-3 shown in FIGS. 1 and 2, the shutter speed dial 10-4, the exposure correction dial 10-5, the MENU/OK button 10-7, the arrow key 10-8, the reproduction button 10-9, and the like. The signal from the operation section 38 is input to the CPU 40. The CPU 40 controls the circuits of the imaging device 1 on the basis of the input signal. For example, the CPU 40 performs photography operation control, image processing control, image data recording/reproduction control, display control for the liquid crystal monitor (LCD) 30, and the like.

The shutter release button 10-3 (FIG. 1) is an operation button for inputting an instruction to start photography, and is formed as a two-stage-stroke-type switch including a S1 switch, which is turned on when pressed halfway, and a S2 switch which is turned on when pressed fully.

In the photography mode, subject light is imaged on the light receiving surface of the image sensor 14 through the photography optical system 12.

The CPU 40 issues a command to eliminate electric charge accumulated in the capacitor SC of each reading section 16 of the image sensor 14 through a sensor control section 32, or a command to read a signal corresponding to the electric charge accumulated in the capacitor SC. The image sensor 14 sequentially outputs the signals (digital signals) of individual divided regions of all the pixels to an image input controller 22 when receiving the command to read the signals from the sensor control section 32. It should be noted that the image sensor 14 may select a desired divided region among the plurality of divided regions of each pixel in response to the command from the CPU 40, and may selectively read the signal of the selected divided region. Consequently, the sensor control section 32 has an electronic diaphragm section (not shown in the drawing), and the electronic diaphragm section may select a divided region which is read the reading section 16, on the basis of the aperture value, and the image sensor 14 may read the signal from only the selected divided region.

The image sensor 14 sequentially outputs the signals (digital signals) of individual divided regions of all or selected pixels to the image input controller 22 when receiving the command to read the signals from the sensor control section 32.

The digital signals of individual divided regions of all the pixels, which are read from the image sensor 14, are temporarily stored in the memory (SDRAM: Synchronous Dynamic Random Access Memory) 48 through the image input controller 22.

A digital signal processing section (pixel signal generation section, electronic diaphragm section) 24 adds the digital signals corresponding to the plurality of divided regions of each pixel among the digital signals stored in the memory 48, thereby generating a pixel signal for each pixel. In the present example, one pixel has 36 divided regions, and thus the digital signals of individual maximum 36 divided regions are added, thereby generating the pixel signal of one pixel. Further, by selecting the signals of the divided regions corresponding to the aperture value among the digital signals of the individual 36 divided regions and performing addition thereof, the aperture value can be electronically controlled. It should be noted that details thereof will be described later.

The digital signal processing section (image generation section) 24 performs predetermined signal processing on the generated pixel signals. The signal processing includes offset processing, gain control processing including white balance correction and sensitivity correction, demosaic processing, gamma correction processing, processing (YC processing) of generating luminance data Y and color difference data Cr and Cb, and the like. Here, the demosaic processing is processing of calculating information of all colors for each pixel from the RGB mosaic image corresponding to a color filter array of a single-plate-type image sensor 14, and is also referred to as synchronization processing. For example, in the case of the image sensor 14 having color filters 14-8 of three colors of RGB, the demosaic processing is processing of calculating information of all colors of RGB for each pixel from the mosaic image having RGB colors.

The image data, which is processed by the digital signal processing section 24, is input to a video random access memory (VRAM) 50. The image data, which is read from the VRAM 50, is encoded by a video encoder 28, and output to the liquid crystal monitor 30 provided on the rear surface of the camera main body 10, thereby allowing a subject image to be displayed on the display screen of the liquid crystal monitor 30.

If the shutter release button 10-3 of the operation section 38 is pressed down to a first stage (pressed halfway), the CPU 40 starts an auto exposure (AE) operation. Then, the digital signals, which are input through the image sensor 14 and the image input controller 22, are received in an AE detection section 44.

The AE detection section 44 sums up the digital signals corresponding to the entire screen, or sums up the digital signals, which are differently weighted between the screen central portion and the peripheral portion, and outputs the value of summation to the CPU 40. The CPU 40 calculates a brightness (photography Ev value) of a subject from the value of summation which is input from the AE detection section 44, and determines an aperture value of a diaphragm (not shown in the drawing) and an electronic shutter (shutter speed) of the image sensor 14 on the basis of the photography Ev value, in accordance with a predetermined program diagram. The CPU 40 controls the diaphragm on the basis of the determined aperture value, and controls a time period of electric charge accumulation in the image sensor 14 through sensor control section 32 on the basis of the determined shutter speed.

An AF (auto focus) detection section 46 sums up absolute values of high-frequency components of the digital signals which are received when the shutter release button 10-3 is pressed halfway and correspond to an AF area, and outputs the sum (AF evaluation value) to the CPU 40. The CPU 40 causes the lens control section 34 to move a focus lens (not shown in the drawing) of the interchangeable lens unit 12 from a close range toward the infinity, search for an in-focus position at which the AF evaluation value detected by the AF detection section 46 is at the maximum, and move the focus lens to the in-focus position, thereby being able to perform focus adjustment on a subject (main subject).

If the AE operation and the AF operation end and the shutter release button 10-3 is pressed down to a second stage (pressed fully), the digital signals are output from the image sensor 14 in response to the pressing, and temporarily stored in the memory 48 through the image input controller 22. The digital signals temporarily stored in the memory 48 are appropriately read by the digital signal processing section 24. Here, the predetermined signal processing mentioned above is performed, and processed luminance data Y and color difference data Cr and Cb are stored in the memory 48 again.

The luminance data Y and color difference data Cr and Cb stored in the memory 48 is output to a compression decompression processing section 26, predetermined compression processing such as a joint photographic experts group (JPEG) is performed. The compressed image data is generated as an image file to which necessary supplementary information such as photography date and time and photography conditions is added, and is recorded into a memory card 54 through a medium controller 52.

Further, if the reproduction button 10-9 of the operation section 38 is operated so as to switch the photography mode to the reproduction mode, the image file recorded in the memory card 54 can be read through the medium controller 52. The image data, which is compressed in the image file read from the memory card 54, is subjected to decompression processing through the compression decompression processing section 26, and subsequently stored in the VRAM 50. Then, the image data stored in the VRAM 50 is encoded by the video encoder 28, is output to the liquid crystal monitor 30, and is thereby displayed as a reproduction image on the display screen of the liquid crystal monitor 30.

<Electronic Diaphragm>

The imaging device 1 of the present invention does not have a mechanical diaphragm that controls an aperture of the diaphragm, and has the electronic diaphragm section so as to electronically control the aperture value. The electronic diaphragm section may be provided in the sensor control section 32 as described above, and may be provided in the digital signal processing section 24. In a case where the electronic diaphragm section is provided in the sensor control section 32, the electronic diaphragm section selects the divided regions which are read by the reading sections 16 on the basis of the aperture value. In contrast, in a case where the electronic diaphragm section is provided in the digital signal processing section 24, the electronic diaphragm section selects the signals from the signals of the plurality of divided regions, which are read by the reading sections 16, on the basis of the aperture value.

Figure 7A:
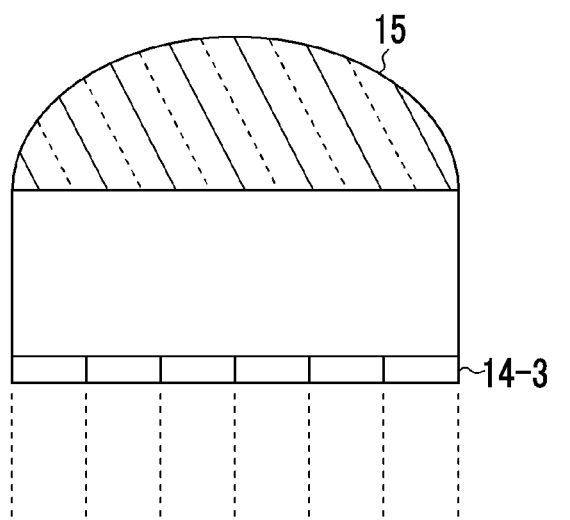
FIGS. 7A and 7B are diagrams illustrating a relationship between separated electrodes and aperture values.
Figure 7B:
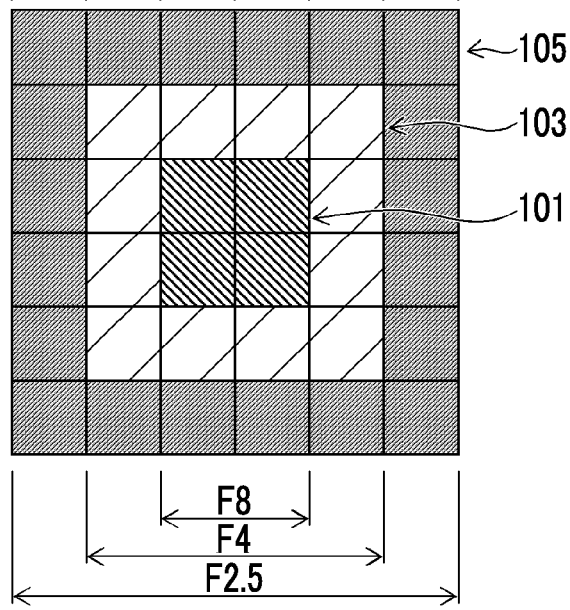

FIGS. 7A and 7B are diagrams illustrating a relationship between the lower electrodes (separated electrodes) 14-3 and the aperture values.

FIG. 7A is a schematic sectional view illustrating a configuration of one pixel of the above-mentioned image sensor 14. Further, FIG. 7B is a schematic diagram of the separated electrodes 14-3 as viewed from the just above. In the example shown in FIG. 7A, the separated electrodes 14-3 are divided with the same division widths. Thereby, the separated electrodes 14-3 can effectively be manufactured. It should be noted that the pixel shown in FIG. 7A is the same as the pixel described in FIG. 4. However, for convenience of description, only the microlens 15 and the separated electrodes 14-3 are shown, and the others are omitted.

As shown in (FIG. 7A, in the sectional view, the separated electrodes 14-3 are divided as six pieces. Further, as shown in FIG. 7B, when the separated electrodes 14-3 are viewed from the just above, the separated electrodes 14-3 are formed of 6×6, 36 divided regions.

As shown in FIG. 4 and FIG. 7B, in the present example, in a case where the photography optical system 12 is a single focus lens (in a case of a wide end in a zoom lens), light is incident to 6×6, 36 divided regions 105. Further, the aperture value at this time is set to F2.5.

Here, if the mechanical diaphragm is controlled such that it is stopped down to F8, in the image sensor 14, light is incident to only the vicinities of 2×2, 4 divided regions 101 which are positioned at the center of the pixel. Accordingly, only the signals of the 4 divided regions 101 constitutes a signal (pixel signal) of one pixel, whereby it is possible to acquire an image which is the same as the image obtained when the mechanical diaphragm is stopped down to the aperture value F8. Accordingly, selecting the signals of the 2×2, 4 divided regions 101 positioned at the center of the pixel shown in FIG. 7B corresponds to capturing an image at the aperture value F8.

Likewise, as shown in FIG. 7B, the signals of the 4×4, 16 divided regions 103 positioned at the center of the pixel correspond to the aperture value F4, the signals of the 6×6, 36 divided regions 105 positioned at the center of the pixel correspond to the aperture value F2.5.

In the imaging device 1 of the present invention, the pixel signal generation section generates the pixel signal, on the basis of the signals selected by the electronic diaphragm section in accordance with the aperture value, and image generation section generates an image, on the basis of the pixel signal. Thereby, in the imaging device 1, by setting a desired aperture value in the electronic diaphragm section, it is possible to acquire an image corresponding to the aperture value even without the mechanical diaphragm.

Next, a description will be given of acquiring an image for each aperture value of the plurality of aperture values through a single photography operation.

In the imaging device 1, the electronic diaphragm section selects signals corresponding to the plurality of aperture values by setting the plurality of aperture values. Further, in a case where the aperture value is not set, the sensor control section 32 controls the reading sections 16 such that those temporarily reads all the divided regions of the pixel. Thereafter, the electronic diaphragm section performs selection on the signals of the divided regions corresponding to the aperture values, in accordance with a user's desired aperture value. At this time, in the case where the plurality of aperture values is set, the signal of the divided region corresponding to each aperture value is selected. Then, the pixel signal generation section generates the pixel signal on the basis of the signals of the selected divided regions. Subsequently, in the case where the plurality of aperture values is set, the image generation section generates an image for each aperture value.

Specifically, the electronic diaphragm section performs control such that the reading sections 16 read all signals (signals of the 6×6, 36 divided regions) of the single pixel shown in FIG. 7B. Thereafter, the pixel signal generation section generates a pixel signal on the basis of the signals acquired from the divided regions corresponding to the respective aperture values, and the image generation section generates images corresponding to the respective aperture values. Thereby, it is possible to acquire an image for each aperture value of the plurality of aperture values through a single photography operation.

Next, a description will be given of changing the exposure time period in accordance with the divided regions selected by the electronic diaphragm section.

Figure 8:
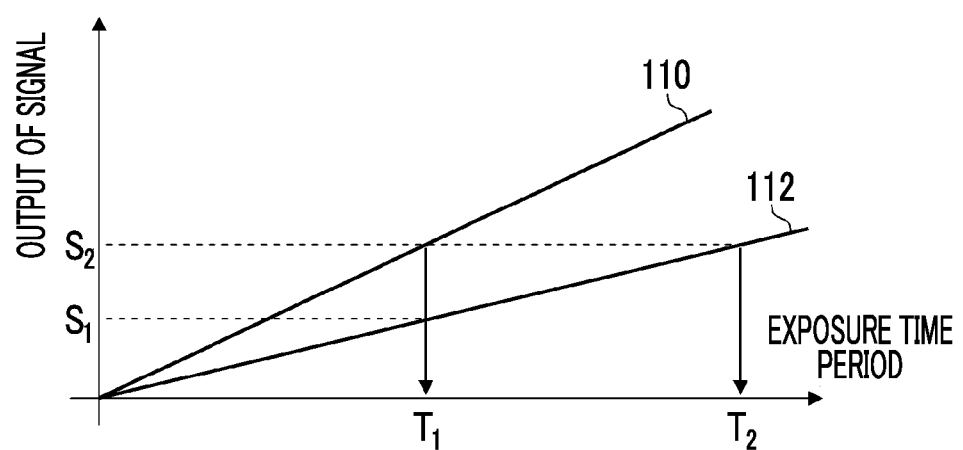
FIG. 8 is a diagram illustrating a relationship between the exposure time period and the signal which is read from a separated electrode.

FIG. 8 is a diagram illustrating exposure time periods and outputs of signals which are read from the separated electrodes 14-3. In FIG. 8, the horizontal axis indicates the exposure time period, and the vertical axis indicates the output of the pixel signal, where an output value 110 of the pixel signal at F2.5 and an output value 112 of the pixel signal at F8 are shown.

Regarding the pixel signal corresponding to the open-side aperture value equal to F2.5, the signals are obtained from many divided regions (36 divided regions in FIG. 7B), and thus $S_2$ as an output value of the signal can be obtained at $T_1$ as an exposure time period. Here, $S_2$ indicates an output value of a signal which is enough to generate an image. In contrast, regarding the pixel signal corresponding to the small-aperture-side aperture value equal to F8, the signals are obtained from a few divided regions (4 divided regions in FIG. 7B), and thus $S_1$ as an output value of the signal can be obtained at $T_1$ as the exposure time period. Here, $S_1$ indicates an output value of a signal which is enough to generate an image but a slightly dark image. However, regarding the output value 112 of the pixel signal at F8, the pixel signal value becomes $S_2$ when the exposure time period becomes $T_2$.

Accordingly, in a case where the reading sections 16 read the signals from the divided regions corresponding to the small-aperture-side aperture value, it is preferable that the reading sections 16 change the exposure time period of the signals on the basis of a plurality of aperture values and read the signals in a nondestructive manner. As an exemplary method of changing the exposure time period is changed, there is a method of changing timing of reading the signals. Specifically, in a case of generating the pixel signal in accordance with the open-side aperture value, the reading sections 16 read the signals at the exposure time period $T_1$, and thereafter continuously accumulate electric charge directly without eliminating electric charge of the capacitor SC and read the signals again at the exposure time period $T_2$. Thereby, even in a case of generating an image on the basis of only the divided regions corresponding to the small-aperture-side aperture value, it is possible to secure a sufficient amount of light. It should be noted that the small-aperture-side aperture value means, for example, an aperture value equal to or greater than F8, and the open-side aperture value means an aperture value equal to or less than F2.

Further, as another method, in a case where electric charge accumulation is stopped at the exposure time period $T_1$ and the divided regions corresponding to the small-aperture-side aperture value are selected, the reading sections 16 may repeatedly read the signals of the divided regions, and may add the signals. According to this method, also a captured image has a sufficient amount of light even in a case where the electronic diaphragm section selects the divided regions in accordance with the small-aperture-side aperture value.

The imaging device 1 of the present invention has pixels each of which is formed of a plurality of divided regions, and the signals can be read from respective divided regions. Therefore, desired blurring can be represented (blurring control).

Figure 9A:
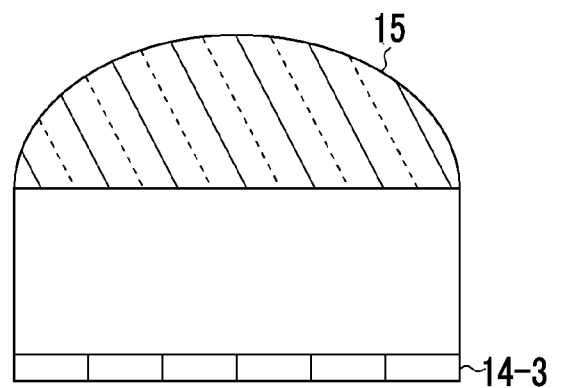
FIGS. 9A and 9B are diagrams illustrating a relationship between amplification degrees and the divided regions.
Figure 9B:
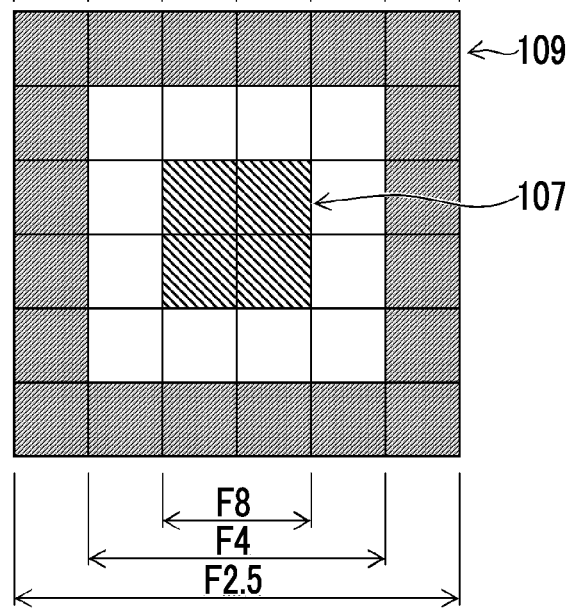

FIGS. 9A and 9B are diagrams illustrating a relationship between the amplification degrees and the divided regions in the pixel shown in FIGS. 7A and 7B. As shown in FIG. 9B, the divided regions 107, which are positioned in the central portion of the pixel, are able to enhance the amplification degrees, and the divided regions 109, which are positioned in the peripheral portion of the pixel, are able to reduce the amplification degrees. Thereby, clean blurring can be realized. That is, the imaging device 1 of the present invention has an amplification section (not shown in the drawing). The amplification section reduces the amplification degrees of the signals which are read from the divided regions in the peripheral portion of the pixel such that the amplification degrees are less than the amplification degrees of the signals which are read from the divided regions in the central portion of the pixel. Thereby, blurring control is implemented. In addition, the amplification section is, for example, provided in the signal processing section 18-3, and the amplification degree is represented as a degree of gain.

Further, the amplification degree may be gradually reduced from the central portion of the pixel toward the peripheral portion. Specifically, the amplification degrees of the divided regions 107 positioned in the central portion shown in FIG. 9B may be adjusted to be largest, and the amplification degrees of the divided regions 109 positioned in the peripheral portion shown in FIG. 9B may be adjusted to be smallest. In addition, the divided regions 109 positioned in the peripheral portion means 20 divided regions disposed around the periphery of the pixel.

Furthermore, in the imaging device 1, in a case where the signals are read from the plurality of divided regions, the exposure time periods of the signals from the divided regions 107 in the central portion of the pixel are set to be longer than the exposure time periods of the signals from the divided regions 109 in the peripheral portion of the pixel. Thereby, blurring control may be implemented.

That is, in a case of reading the signals from the divided regions 107 in the central portion of the pixel, the electronic diaphragm section performs control to perform exposure for a longer time period and subsequently read the signals. In contrast, in a case of reading the signals from the divided regions 109 positioned in the peripheral portion of the pixel, the electronic diaphragm section performs control to perform exposure for a shorter time period and read the signals. In such a manner, by changing reading timing, it is possible to change a length of the exposure time period.

As described above, the imaging device 1 reduces the gains or shortens the exposure time periods in the peripheral portion of the pixel. In such a manner, it is possible to obtain an effect of lowering an amount of light in the peripheral portion of the lens. Thereby, it is possible to perform blurring control without using a special lens.

Modification Example 1

According to the present example, there are provided the divided regions which have smaller division widths in the center portion of the pixel than those in the peripheral portion of the pixel. Thereby, in the present example, there may be provided the divided regions based on dependency of the aperture value of a ray angle.

Figure 10A:
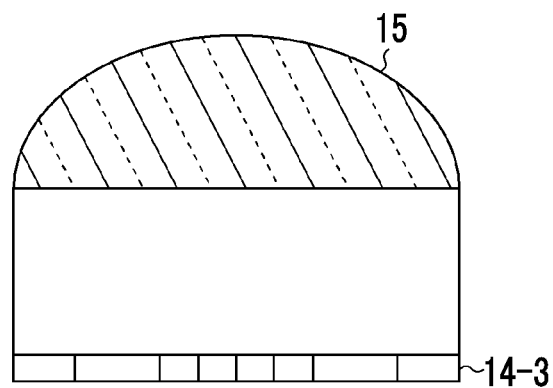
FIGS. 10A and 10B are schematic diagrams illustrating division of the pixel in Modification Example 1.
Figure 10B:
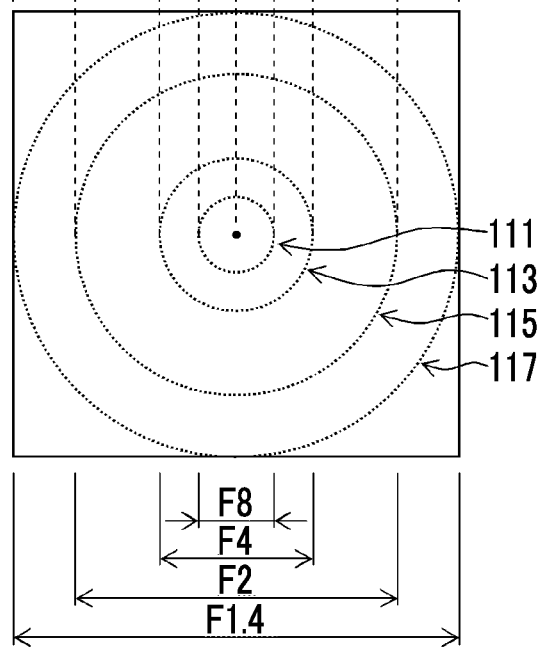

FIGS. 10A and 10B are schematic diagrams illustrating division of the pixel in Modification Example 1, in the pixel shown in FIGS. 7A and 7B. As shown in FIG. 10A, the separated electrodes 14-3 are divided with a small width in the central portion, and are divided with a larger width at a position closer to the peripheral portion. Further, as shown in FIG. 10B, when the pixel is viewed from the just above, the radii of the separated electrodes 14-3 are divided such that a plurality of different concentric circles overlaps with each other.

As shown in FIG. 10B, the divided region 111 corresponding to the aperture value F8 is a circle having a smallest radius, the divided region 113 corresponding to the aperture value F4 is a circle having a radius which is larger than that at the aperture value F8, the divided region 115 corresponding to the aperture value F2 is a circle having a radius which is larger than that at the aperture value F4, and the divided region 117 corresponding to the aperture value F1.4 is a whole area of the pixel. Here, the central portion of the pixel may be the divided region corresponding to the small-aperture-side aperture value (aperture value F8), and the peripheral portion of the pixel may be a divided region in which the divided regions 115 is excluded from the divided regions 117.

In a manner similar to that of Modification Example 1, by dividing the separated electrodes 14-3, the divided regions are based on dependency of the aperture value (F number) of the ray angle. That is, it is preferable that the ray angle is 20° at the aperture value F2, 14° at F2.8, 10° at F4, and the division widths between the divided regions are determined in consideration of such ray angles.

Modification Example 2

In the present example, there are provided divided regions which have different division widths in accordance with the color of the color filter 14-8. Thereby, it is possible to receive light by the divided regions which are quite appropriate even for light with long wavelengths.

Figure 11A:
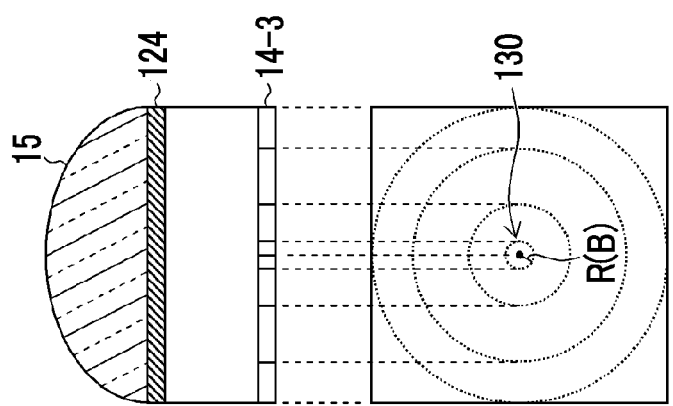
FIGS. 11A to 11C are schematic diagrams illustrating division of the pixel in Modification Example 2.
Figure 11B:
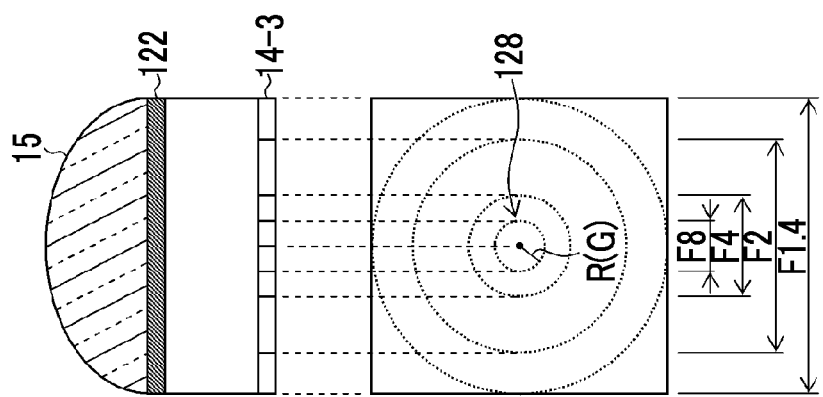
Figure 11C:
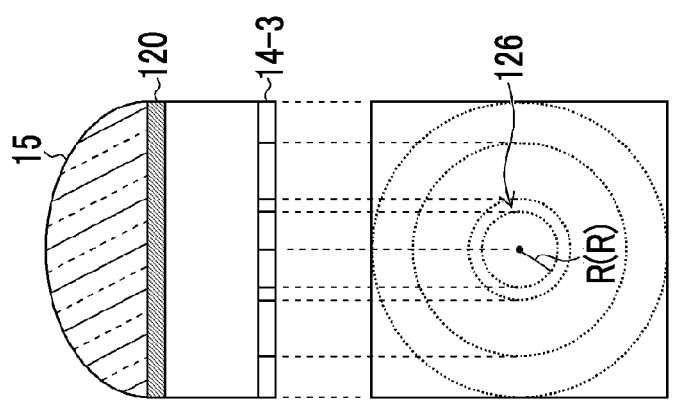

FIGS. 11A to 11C are schematic diagrams illustrating change in division widths of the divided regions corresponding to the small-aperture-side aperture value in accordance with the color of the color filter 14-8.

As shown in FIG. 11A, in a pixel having a red color filter 120, a divided region 126 corresponding to the small-aperture-side aperture value is a circle having a radius R(R). Further, as shown in FIG. 11B, in a pixel having a green color filter 122, a divided region 128 corresponding to the small-aperture-side aperture value is a circle having a radius R(G). Furthermore, as shown in FIG. 11C, in a pixel having a blue color filter 124, a divided region 130 corresponding to the small-aperture-side aperture value is a circle having a radius R(B). Moreover, a relationship of the radius R(R), the radius R(G), and the radius R(B) is represented by the following expression: radius R(R)>radius R(G)>radius R(B). In addition, the image sensor 14 has a filter formed of a plurality of monochromatic color filters 14-8, and the monochromatic color filters 14-8 are provided to correspond to the respective pixels.

As shown in FIG. 11A, in the case of the pixel having the red color filter 120, the division width of the divided region corresponding to the aperture value F8 is greater than the division widths of the divided regions of the pixels having the green color filter 122 and the blue color filter 124 corresponding to the aperture value F8. Thereby, even in a case of long-wavelength light passing through the red color filter 120, the divided region 126 corresponding to the small-aperture-side aperture value is able to receive the light.

As described above, by changing the division width of the divided region of the small-aperture-side aperture value depending on the wavelength of the light, it is possible to receive the light by the divided region which is appropriate even for light with a different wavelength.

Modification Example 3

In the present example, in accordance with the position of the pixel in the image sensor 14, a method of dividing the separated electrodes 14-3 is changed. In the present example, so-called scaling in the image sensor 14 is performed. Thereby, light can be precisely received in the divided regions even in the central and peripheral portions of the image sensor 14.

Figure 12:
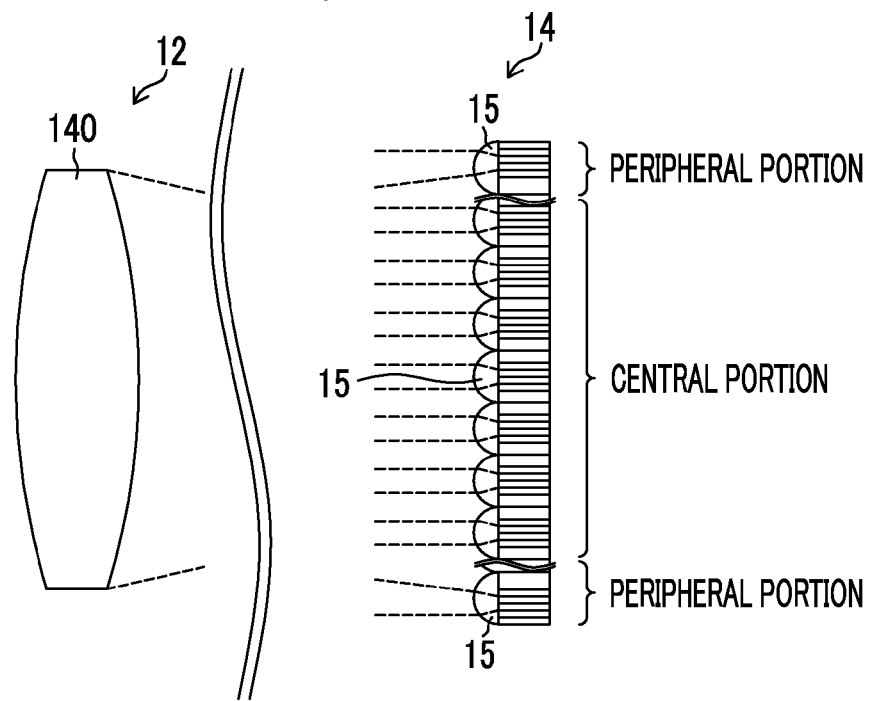
FIG. 12 is a schematic diagram illustrating Modification Example 3.

FIG. 12 is a schematic diagram of a main lens 140 and the image sensor 14 provided in the photography optical system 12.

As shown in FIG. 12, the image sensor 14 is formed of a plurality of pixels. Further, for convenience of description, only necessary parts of the pixels of the image sensor 14 are shown, and the others are omitted.

Each of the pixels, which are disposed in the central portion of the image sensor 14, is divided in symmetric with respect to the center of the pixel. That is, in a sectional view of the separated electrodes 14-3 (refer to FIG. 4, FIG. 7A, FIG. 9A, or FIG. 10A), the separated electrodes 14-3 are divided to be bilaterally symmetric. In the central portion of the image sensor 14, the light is incident along the optical axis, and thus each pixel disposed in the central portion is divided in symmetric with respect to the center of the pixel.

In contrast, each pixel disposed in the peripheral portion of the image sensor 14 is divided in asymmetric with respect to the center of the pixel. That is, the division center of each pixel disposed in the peripheral portion of the image sensor 14 is biased to the peripheral side. For example, in the case of dividing the pixel as shown in FIG. 10B, in the central portion of the image sensor 14, the center of concentric circle coincides with the center of the pixel. In the peripheral portion of the image sensor 14, the center of the concentric circle does not coincide with the center of the pixel, and is biased to the periphery (edge) of the image sensor. Thereby, light, which obliquely enters into the peripheral portion of the image sensor 14, can be precisely received in the divided regions. In addition, the peripheral portion of the image sensor means a portion corresponding to 10 pixels, preferably 5 pixels from the edge of the image sensor, and the central portion of the image sensor means a portion other than the peripheral portion of the image sensor.

As described above, in accordance with the position of the pixel in the image sensor 14, by changing the division center of the separated electrodes 14-3, it is possible to perform scaling, and it is possible to appropriately receive light on the front side of the image sensor 14.

Other Embodiments

In the above description, mainly, the imaging device 1 has been described, but the present invention is not limited to this. For example, it is possible to adopt an imaging method for implementing the present invention.

Examples of other embodiments of the imaging device 1 include a mobile phone having a camera function, a smartphone, a personal digital assistant (PDA), and a portable game machine. Hereinafter, a detailed description will be given of an example of a smartphone with reference to the accompanying drawings.

<Configuration of Smartphone>

Figure 13:
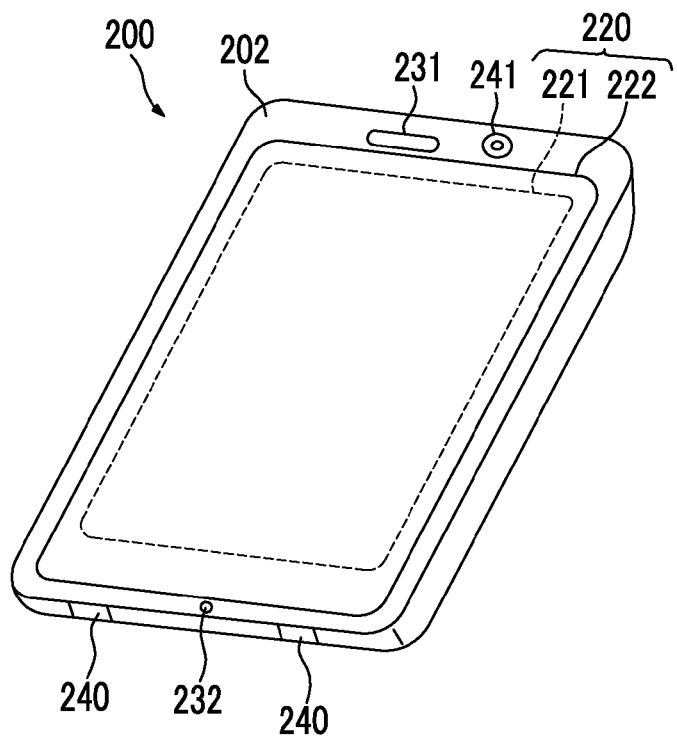
FIG. 13 is a diagram illustrating an embodiment of a photography apparatus according to the present invention.

FIG. 13 shows an appearance of a smartphone 200 which is another embodiment of the imaging device 1. The smartphone 200 shown in FIG. 13 includes: a housing 202 that has a flat plate shape; a display panel 221 as a display section on one side of the housing 202; and a display input section 220 into which an operation panel 222 as an input section is integrated. Further, the housing 202 includes a speaker 231, a microphone 232, operation sections 240, and a camera section 241. It should be noted that the configuration of the housing 202 is not limited to this. For example, it may be possible to adopt a configuration in which the input section and the display section are independently provided, or it may be possible to adopt a configuration having a slide mechanism or a folded structure.

Figure 14:
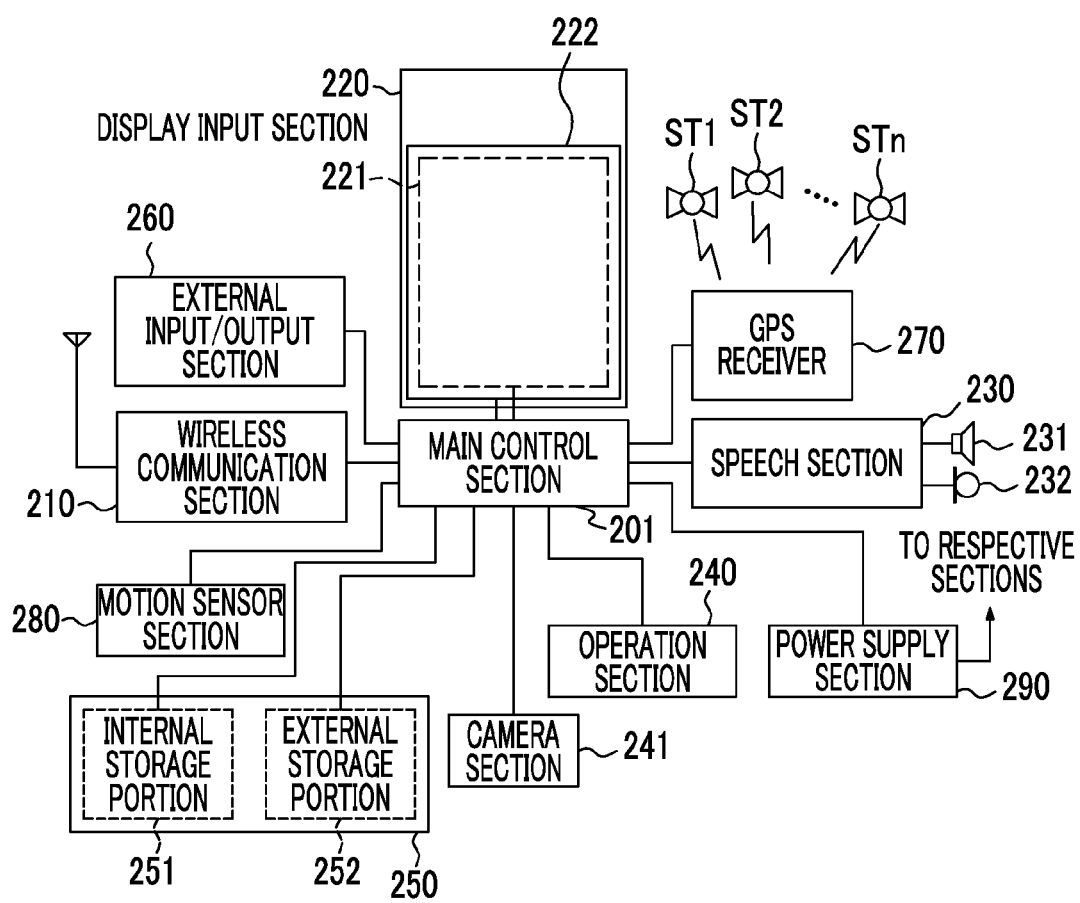
FIG. 14 is a block diagram illustrating a configuration of the photography apparatus shown in FIG. 13.

FIG. 14 is a block diagram illustrating a configuration of the smartphone 200 shown in FIG. 13. As shown in FIG. 14, the smartphone 200 includes, as main components, a wireless communication section 210, a display input section 220, a speech section 230, the operation sections 240, the camera section 241, a storage section 250, an external input/output section 260, a global positioning system (GPS) receiver 270, a motion sensor section 280, a power supply section 290, and a main control section 201. As the main function of the smartphone 200, there is provided a wireless communication function for performing mobile wireless communication with a base station device BS through a mobile communication network NW.

The wireless communication section 210 performs wireless communication with the base station device BS, which is included in the mobile communication network NW, in accordance with an instruction of the main control section 201. Using this wireless communication, various kinds of file data such as audio data and image data, e-mail data, and the like are transmitted and received, and web data, streaming data, and the like are received.

The display input section 220 is a so-called touch panel, and includes the display panel 221 and the operation panel 222. The touch panel displays image (still image and moving image) information, text information, or the like so as to visually transfer the information to a user in accordance with control of the main control section 201, and detects a user operation on the displayed information. In a case of monitoring a generated 3D image, it is preferable that the display panel 221 is a 3D display panel.

The display panel 221 uses a liquid crystal display (LCD), an organic electro-luminescence display (OELD), or the like as a display device.

The operation panel 222 is a device that is provided for viewing an image which is displayed on a display screen of the display panel 221 and that detects a single pair of coordinates or a plurality of pairs of coordinates at which an operation is performed by a user's finger or a stylus. When such a device is operated by a user's finger or a stylus, the device outputs a detection signal, which is generated due to the operation, to the main control section 201. Subsequently, the main control section 201 detects an operation position (coordinates) on the display panel 221, on the basis of the received detection signal.

As shown in FIG. 13, the display panel 221 and the operation panel 222 of the smartphone 200 are integrated to constitute the display input section 220. However, the operation panel 222 is disposed to completely cover the display panel 221. When this arrangement is adopted, the operation panel 222 may have a function of also detecting a user operation in a region outside the display panel 221. In other words, the operation panel 222 may include a detection region (hereinafter referred to as a display region) for a part which overlaps with the display panel 221 and a detection region (hereinafter referred to as a non-display region) for the other part at the outer edge which does not overlap with the display panel 221.

A size of the display region and a size of the display panel 221 may completely coincide with each other, but it is not always necessary for both to coincide with each other. Further, the operation panel 222 may include two sensing regions of the outer edge part and the other inside part. Furthermore, a width of the outer edge part is appropriately designed depending on a size of the housing 202 and the like. In addition, examples of the position detection method adopted by the operation panel 222 may include a matrix switch method, a resistance film method, a surface elastic wave method, an infrared method, an electromagnetic induction method, and an electrostatic capacitance method, and the like, and any method may be adopted.

The speech section 230 includes a speaker 231 and a microphone 232. The speech section 230 is able to convert a sound of a user, which is input through the microphone 232, into sound data, which can be processed in the main control section 201, and output the data to the main control section 201, and decodes sound data, which is received by the wireless communication section 210 or the external input/output section 260, and outputs the data from the speaker 231. Further, as shown in FIG. 13, for example, the speaker 231 can be mounted on the same surface as the surface on which the display input section 220 is provided. In addition, the microphone 232 can be mounted on a side surface of the housing 202.

The operation section 240 is a hardware key using a key switch or the like, and receives an instruction from a user. For example, the operation sections 240 are pressing button type switches which are mounted on the lower side surface of the lower part of the housing 202 of the smartphone 200. Each switch is turned on if it is pressed by a finger or the like, and is turned off due to restoring force of a spring if the finger is released.

The storage section 250 stores a control program and control data of the main control section 201, the first filter according to the present invention, address data in which names, phone numbers, and the like of communication partners are associated, received and transmitted e-mail data, web data which is downloaded by web browsing, and downloaded contents data, and temporarily stores streaming data and the like. Further, the storage section 250 is constituted of an internal storage portion 251, which is built into the smartphone, and an external storage portion 252 which has a removable external memory slot. In addition, each of the internal storage portion 251 and the external storage portion 252 constituting the storage section 250 is implemented by using a storage medium such as a flash memory type, a hard disk type, a multimedia card micro type, a card type memory (such as a Micro SD (registered trademark) memory), a random access memory (RAM), or a read only memory (ROM).

The external input/output section 260 has a function of an interface with all external devices connected to the smartphone 200. The external input/output section 260 is for communication (such as universal serial bus (USB) or IEEE1394) with other external devices, direct or indirect connection to networks (such as the Internet, wireless LAN, Bluetooth (registered trademark), radio frequency identification (RFID), infrared communication (Infrared Data Association: IrDA) (registered trademark), ultra wideband (UWB) (registered trademark), and ZigBee (registered trademark)), or the like.

Examples of the external devices connected to the smartphone 200 include a wired/wireless headset, a wired/wireless external charger, a wired/wireless data port, a memory card which is connected through a card socket, a subscriber identity module (SIM) or user identity module (UIM) card, external audio and video devices which are connected through audio and video input/output (I/O) terminals, external audio and video devices which are connected in a wireless manner, a smartphone which is connected in a wired or wireless manner, a personal computer which is connected in a wired or wireless manner, a PDA which is connected in a wired or wireless manner, earphones, and the like. The external input/output section is able to transfer the data, which is transmitted from such external devices, to the components within the smartphone 200, and to transmit the data within the smartphone 200 to the external devices.

The GPS receiver 270 receives a plurality of GPS signals, which are transmitted from GPS satellites ST1 to STn, in accordance with instructions of the main control section 201, executes positioning calculation processing based on the received GPS signals, and detects a position formed of a latitude, a longitude, and an altitude of the smartphone 200. The GPS receiver 270 may detect the position by using position information when it is possible to acquire the position information from the wireless communication section 210 or the external input/output section 260 (for example, wireless LAN).

The motion sensor section 280 includes, for example, a triaxial acceleration sensor, and detects physical movement of the smartphone 200, in accordance with an instruction of the main control section 201. By detecting physical movement of the smartphone 200, an acceleration and a direction of the movement of the smartphone 200 are detected. This detection result is output to the main control section 201.

The power supply section 290 supplies the respective sections of the smartphone 200 with electric power, which is stored in a battery (not shown), in accordance with an instruction of the main control section 201.

The main control section 201 includes a micro processor, and integrally controls the respective sections of the smartphone 200 by performing an operation on the basis of control data or a control program stored in the storage section 250. Further, the main control section 201 has an application processing function and a mobile communication control function of controlling the respective sections of a communication system in order to perform data communication and sound communication through the wireless communication section 210.

The application processing function is implemented by an operation of the main control section 201 using application software stored in the storage section 250. Examples of the application processing function include: an infrared communication function of performing data communication with other devices by controlling the external input/output section 260; an e-mail function of transmitting and receiving e-mails; a web browsing function of browsing web pages; and the like.

The main control section 201 has an image processing function of displaying a video on the display input section 220 and the like, on the basis of image data (still image and moving image data) such as received data and downloaded streaming data. The image processing function means a function of causing the main control section 201 to decode the image data, apply image processing to the corresponding decoding result, and display an image on the display input section 220.

The main control section 201 executes display control for the display panel 221 and operation detection control to detect the user operation through the operation sections 240 and the operation panel 222.

Through execution of the display control, the main control section 201 displays an icon for activating application software and a window for displaying a software key such as a scroll bar or creating an e-mail. In addition, the scroll bar means a software key for receiving an instruction to move a display portion of an image on a large image which cannot be entirely shown in the display region of the display panel 221.

Through execution of the operation detection control, the main control section 201 detects the user operation performed through the operation section 240, receives an operation performed on the icon or a text input performed in an input field of the window through the operation panel 222, or receives a request to scroll a displayed image through the scroll bar.

The main control section 201 has a touch panel control function performed through execution of the operation detection control. The function determines whether the operation position of the operation panel 222 is in the overlapping part (display region) which overlaps with the display panel 221 or the other part (non-display region) at the outer edge which does not overlap with the display panel 221, and controls the display position of the software key or the sensing region of the operation panel 222.

The main control section 201 may detect a gesture operation performed on the operation panel 222, and may execute a preset function in response to the detected gesture operation. The gesture operation is not a simple touch operation used in the past. The gesture operation means an operation for drawing a locus with a finger or the like, an operation of specifying a plurality of positions at the same time, or an operation of drawing loci from a plurality of positions to at least one position as a combination of the above-mentioned operations.

The camera section 241 is a digital camera for performing electronic photography by using the imaging element such as a complementary metal oxide semiconductor (CMOS) or a charge-coupled device (CCD). The above-mentioned imaging device 1 can be applied to the camera section 241. Since it is possible to capture a wide-angle image and a telephoto image without a mechanical switching mechanism or the like, the imaging device 1 is appropriately used as a camera section which is built into a thin portable terminal such as the smartphone 200.

Under the control of the main control section 201, the camera section 241 is able to convert the image data, which is obtained through image capturing, into compressed image data such as data of a joint photographic coding experts group (JPEG), and to record the data in the storage section 250 and to output the data through the external input/output section 260 or the wireless communication section 210. In the smartphone 200 shown in FIG. 13, the camera section 241 is mounted on the same side as the display input section 220. However, the mounting position of the camera section 241 is not limited to this. The camera section 241 may be mounted on the rear side of the display input section 220, or a plurality of camera sections 241 may be mounted. In addition, in the case where a plurality of camera sections 241 is mounted, photography may be performed using a single camera section 241 by switching the camera section 241 for the photography, or photography may be performed using the plurality of camera sections 241 at the same time.

The camera section 241 can be used in various functions of the smartphone 200. For example, an image, which is acquired by the camera section 241, can be displayed on the display panel 221, and an image of the camera section 241 as one of the operation inputs of the operation panel 222 can be used. Further, when the GPS receiver 270 detects a position, the GPS receiver 270 may detect the position with reference to the image acquired from the camera section 241. Furthermore, it may be possible to determine a direction of optical axis of the camera section 241 of the smartphone 200 or determine a current user environment, using the GPS receiver 270 in a combination with the triaxial acceleration sensor or without using the triaxial acceleration sensor, with reference to the image acquired from the camera section 241. Needless to say, the image acquired from the camera section 241 may be used in the application software.

EXPLANATION OF REFERENCES

1: imaging device
10: camera main body
10-1: mount
10-2: finder window
10-3: shutter release button
10-4: shutter speed dial
10-5: exposure correction dial
10-6: eyepiece section
10-7: OK button
10-8: arrow key
10-9: reproduction button
12: photography optical system
14: image sensor
14-1: substrate
14-2: insulation layer
14-3: separated electrode
14-4: organic layer 14-5: upper electrode
14-6: buffer layer
14-7: sealing layer
14-8: color filter
15: microlens
16: reading section
18-1: vertical driver
18-2: timing generator
18-3: signal processing section
18-4: horizontal driver
18-6: serial conversion section
22: image input controller
24: digital signal processing section
26: compression decompression processing section
28: encoder
30: liquid crystal monitor
32: sensor control section
34: lens control section
38: operation section
40: CPU
44: AE detection section
46: AF detection section
48: memory
50: VRAM
52: controller
54: memory card
200: smartphone
201: main control section
202: casing
210: wireless communication section
220: display input section
221: display panel
222: operation panel
230: speech section
231: speaker
232: microphone
240: operation section
241: camera section
250: storage section
251: internal storage section
252: external storage section
260: external input/output section
270: GPS receiving section
280: motion sensor section
290: power supply section

What is claimed is:

1. An imaging device comprising:
an image sensor that is configured such that a plurality of pixels having an organic layer for photoelectric conversion is two-dimensionally arranged, and each pixel of the plurality of pixels is divided into a plurality of regions, and has an on-chip microlens, which forms a pupil image of a photography optical system on the plurality of regions, and reading sections which respectively read photoelectrically converted signals of the divided regions; and
an electronic diaphragm section that electronically controls an aperture value, and that selects a divided region, which is read by the reading section, on the basis of the aperture value, or selects a signal from the signals of the plurality of divided regions, which are read by the reading sections, on the basis of the aperture value.

2. The imaging device according to claim 1, further comprising an image generation section that generates an image on the basis of the signals, which are read by the reading sections from the divided regions selected by the electronic diaphragm section, or the signals selected by the electronic diaphragm section,
wherein the electronic diaphragm section reads the signals from the plurality of divided regions corresponding to a plurality of aperture values, or selects the signals of the plurality of divided regions corresponding to the plurality of aperture values, and
wherein the image generation section generates an image for each of the aperture values of the plurality of aperture values.

3. The imaging device according to claim 1, wherein each pixel of the image sensor has divided regions which have smaller division widths in the center portion of the pixel than those in the peripheral portion of the pixel.

4. The imaging device according to claim 1, wherein each pixel of the image sensor has divided regions which have the same division widths.

5. The imaging device according to claim 1,
wherein the image sensor has a filter constituted of a plurality of monochromatic color filters,
wherein the monochromatic color filters are disposed to correspond to the pixels, and
wherein the pixels have divided regions which have different division widths in accordance with colors of the monochromatic color filters.

6. The imaging device according to claim 1, wherein each pixel of the image sensor disposed in the central portion of the image sensor is divided into regions symmetric to each other with respect to the center of the pixel, and each pixel of the image sensor disposed in the peripheral portion of the image sensor is divided into regions non-symmetric to each other with respect to the center of the pixel.

7. The imaging device according to claim 1, wherein the reading sections change the exposure time periods of the signals based on the plurality of aperture values and perform non-destructive reading when reading the signals from the plurality of divided regions corresponding to the plurality of aperture values through the electronic diaphragm section, and the electronic diaphragm section performs exposure for a longer time when selecting the divided regions on the basis of the aperture values on a small-aperture side than when selecting the divided regions on the basis of the aperture values on an open-side.

8. The imaging device according to claim 1, further comprising an amplification section that amplifies the signals which are read by the reading sections,
wherein the amplification section makes amplification degrees of the signals, which are read from the divided regions in the peripheral portion of the pixel, smaller than amplification degrees of the signals which are read from the divided regions in the central portion of the pixel.

9. The imaging device according to claim 1, wherein when the reading section reads the signals from the plurality of divided regions, the exposure time periods of the signals from the divided regions in the central portion of the pixel are set to be longer than the exposure time periods of the signals from the divided regions in the peripheral portion of the pixel.

10. An imaging method comprising:
a reading step of respectively reading photoelectrically converted signals of a plurality of regions by using an image sensor that is configured such that a plurality of pixels having an organic layer for photoelectric conversion is two-dimensionally arranged, where each pixel of the plurality of pixels is divided into the plurality of regions, and each pixel has an on-chip microlens which forms a pupil image of a photography optical system on the plurality of regions; and an electronic diaphragm step of electronically controlling an aperture value, and selecting divided regions, which are read by the reading sections, on the basis of the aperture value, or selecting signals from the signals of the plurality of divided regions, which are read by the reading sections, on the basis of the aperture value.

* * * * *